US011157356B2

(12) United States Patent
Olarig et al.

(10) Patent No.: US 11,157,356 B2
(45) Date of Patent: Oct. 26, 2021

(54) SYSTEM AND METHOD FOR SUPPORTING DATA PROTECTION ACROSS FPGA SSDS

(71) Applicant: Samsung Electronics Co., Ltd., Suwon-si (KR)

(72) Inventors: Sompong Paul Olarig, Pleasanton, CA (US); Fred Worley, San Jose, CA (US); Oscar P. Pinto, San Jose, CA (US); Jason Martineau, Milpitas, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 163 days.

(21) Appl. No.: 16/049,492

(22) Filed: Jul. 30, 2018

(65) Prior Publication Data
US 2019/0272215 A1 Sep. 5, 2019

Related U.S. Application Data

(63) Continuation-in-part of application No. 15/981,801, filed on May 16, 2018.
(Continued)

(51) Int. Cl.
*G06F 11/10* (2006.01)
*G11C 29/52* (2006.01)
(Continued)

(52) U.S. Cl.
CPC .......... *G06F 11/1068* (2013.01); *G06F 3/065* (2013.01); *G06F 3/0619* (2013.01);
(Continued)

(58) Field of Classification Search
CPC .... G06F 11/1068; G06F 3/0619; G06F 3/065; G06F 3/0689; G06F 11/1076;
(Continued)

(56) References Cited

U.S. PATENT DOCUMENTS 7,110,301 B2  9/2006  Lee et al.
7,363,395 B2  4/2008  Seto
(Continued)

FOREIGN PATENT DOCUMENTS

CN         1902616 A    1/2007
CN         106873725 A  6/2017
WO    WO 2008/070191 A2  6/2008

OTHER PUBLICATIONS

Cai et al. FPGA-Based Solid-State Drive Prototyping Platform, 2011, IEEE, pp. 101-104 (Year: 2011).*
(Continued)

*Primary Examiner* — John J Tabone, Jr.
(74) *Attorney, Agent, or Firm* — Lewis Roca Rothgerber Christie LLP

(57) ABSTRACT

A system and method for supporting data protection across field programmable gate array (FPGA) solid state drives (SSDs) includes a storage system having a first group of solid state drives connected to a FPGA. The FPGA includes a first data protection controller configured to manage input/output requests to and from the first group of solid state disks according to a data protection configuration, generate parity bits according to the data protection configuration, and store the parity bits on at least parity solid state drive from the first group of solid state drives.

20 Claims, 10 Drawing Sheets

Related U.S. Application Data

(60) Provisional application No. 62/638,722, filed on Mar. 5, 2018, provisional application No. 62/641,252, filed on Mar. 9, 2018.

(51) Int. Cl.
  *G06F 3/06* (2006.01)
  *G06F 13/16* (2006.01)
  *G06F 13/42* (2006.01)

(52) U.S. Cl.
  CPC .......... *G06F 3/0658* (2013.01); *G06F 3/0689* (2013.01); *G06F 11/1076* (2013.01); *G06F 13/1668* (2013.01); *G06F 13/4282* (2013.01); *G11C 29/52* (2013.01); *G06F 2213/0026* (2013.01)

(58) Field of Classification Search
  CPC ............. G06F 13/1668; G06F 13/4282; G06F 2213/0026; G11C 29/52
  USPC ....... 714/766, 718, 763, 768, 769, 770, 773, 714/6.2, 6.21, 6.22, 6.23, 6.24, 42
  See application file for complete search history.

(56) References Cited

U.S. PATENT DOCUMENTS

| | | | |
|---|---|---|---|
| 8,020,074 B2* | 9/2011 | Fernandes | G06F 11/1076 714/770 |
| 8,249,097 B2 | 8/2012 | Kenkare | |
| 8,560,772 B1* | 10/2013 | Piszczek | G06F 3/0688 711/114 |
| 8,700,951 B1* | 4/2014 | Call | G06F 11/1441 714/22 |
| 8,745,294 B2* | 6/2014 | Cho | G06F 11/1441 710/15 |
| 8,762,648 B2 | 6/2014 | Nakashima et al. | |
| 8,924,776 B1* | 12/2014 | Mollov | G06F 3/0647 714/6.24 |
| 8,949,692 B1* | 2/2015 | Bonwick | G06F 3/0604 714/766 |
| 9,223,693 B2 | 12/2015 | Sinclair et al. | |
| 9,304,902 B2 | 4/2016 | Mehrotra et al. | |
| 9,417,821 B2 | 8/2016 | Slaight et al. | |
| 9,454,492 B2 | 9/2016 | Flynn et al. | |
| 9,501,110 B2 | 11/2016 | Heyd et al. | |
| 9,575,902 B2 | 2/2017 | Flynn et al. | |
| 9,887,008 B2 | 2/2018 | Lee et al. | |
| 10,140,063 B2* | 11/2018 | Worley | G06F 3/0688 |
| 10,140,181 B1* | 11/2018 | Varanasi | G06F 11/1092 |
| 10,275,180 B2* | 4/2019 | Ballapuram | G06F 3/0679 |
| 10,402,266 B1* | 9/2019 | Kirkpatrick | G06F 11/1068 |
| 10,417,092 B2* | 9/2019 | Brennan | G06F 3/0665 |
| 2004/0073806 A1* | 4/2004 | Zimmer | G06F 21/57 713/189 |
| 2004/0177218 A1* | 9/2004 | Meehan | G06F 3/0689 711/114 |
| 2004/0177219 A1* | 9/2004 | Meehan | G06F 1/187 711/114 |
| 2009/0313430 A1* | 12/2009 | Jones | G16H 40/63 711/114 |
| 2010/0128998 A1* | 5/2010 | Wegener | G06T 9/00 382/248 |
| 2011/0010499 A1 | 1/2011 | Tsukamoto et al. | |
| 2011/0161560 A1 | 6/2011 | Hutchison | |
| 2012/0278527 A1* | 11/2012 | Cho | G06F 3/061 711/103 |
| 2014/0189212 A1 | 7/2014 | Slaight et al. | |
| 2014/0365629 A1* | 12/2014 | Umezawa | G06F 11/325 709/223 |
| 2014/0379971 A1* | 12/2014 | Putro | H04N 21/231 711/103 |
| 2015/0019918 A1* | 1/2015 | Li | G06F 11/108 714/54 |
| 2015/0120874 A1 | 4/2015 | Kim et al. | |
| 2015/0160871 A1 | 6/2015 | Takakura | |
| 2015/0220439 A1* | 8/2015 | Mickens | G06F 3/061 711/135 |
| 2015/0324248 A1* | 11/2015 | Tomozaki | G06F 11/1076 714/807 |
| 2016/0239460 A1 | 8/2016 | Ziakas et al. | |
| 2016/0253251 A1* | 9/2016 | Chhaunker | G06F 12/0866 714/6.24 |
| 2016/0259597 A1* | 9/2016 | Worley | G06F 3/0688 |
| 2017/0052841 A1* | 2/2017 | Ogino | G06F 11/0745 |
| 2017/0102895 A1 | 4/2017 | Kim | |
| 2017/0102952 A1 | 4/2017 | Khemani et al. | |
| 2017/0102996 A1* | 4/2017 | Yu | G06F 11/1092 |
| 2017/0155573 A1 | 6/2017 | Khemani et al. | |
| 2017/0160784 A1* | 6/2017 | Fuxa | G06F 12/0873 |
| 2017/0168943 A1 | 6/2017 | Chou | |
| 2017/0228328 A1 | 8/2017 | Armstrong et al. | |
| 2017/0262344 A1* | 9/2017 | Shaw | G06F 3/0653 |
| 2017/0277230 A1 | 9/2017 | Samper | |
| 2017/0300445 A1 | 10/2017 | McKnight | |
| 2017/0364295 A1 | 12/2017 | Sardinha et al. | |
| 2018/0004695 A1 | 1/2018 | Chu | |
| 2018/0032463 A1 | 2/2018 | Olarig | |
| 2018/0082066 A1 | 3/2018 | Munjal et al. | |
| 2018/0095872 A1* | 4/2018 | Dreier | G06F 3/067 |
| 2018/0157428 A1* | 6/2018 | Li | G06F 11/108 |
| 2018/0321876 A1* | 11/2018 | Ballapuram | G06F 3/0679 |
| 2018/0357017 A1* | 12/2018 | Karr | G06F 3/0685 |
| 2018/0357018 A1* | 12/2018 | Karr | G06F 3/0685 |
| 2018/0357019 A1* | 12/2018 | Karr | G06F 3/0685 |
| 2019/0034124 A1* | 1/2019 | Worley | G06F 3/0688 |
| 2019/0042232 A1* | 2/2019 | Trika | G06F 8/75 |
| 2019/0042501 A1* | 2/2019 | Trika | G06F 13/28 |
| 2019/0073265 A1* | 3/2019 | Brennan | G06F 11/1076 |
| 2019/0310953 A1* | 10/2019 | Olarig | H03M 13/154 |
| 2019/0310956 A1* | 10/2019 | Olarig | G06F 13/4022 |
| 2019/0310957 A1* | 10/2019 | Olarig | G06F 13/1668 |
| 2019/0310958 A1* | 10/2019 | Pinto | G06F 13/4282 |

OTHER PUBLICATIONS

Komsul et al., An FPGA-Based Development Platform for Real-Time Solid State Devices, 2014, IEEE, pp. 1198-1203. (Year: 2014).*

Seo et al., RAID—Optimal Data Placement in a Hybrid Solid-State Drive, 2013, IEEE, pp. 651-652. (Year: 2013).*

DataPacket Blog, Advantages and Disadvantages of Various RAID Levels, Jan. 19, 2017, DataCamp Limited, pp. 1-8. (Year: 2017).*

U.S. Office Action dated Jan. 28, 2019, issued in U.S. Appl. No. 15/981,801 (10 pages).

U.S. Office Action dated Jun. 18, 2019, issued in U.S. Appl. No. 15/981,801 (8 pages).

\* cited by examiner

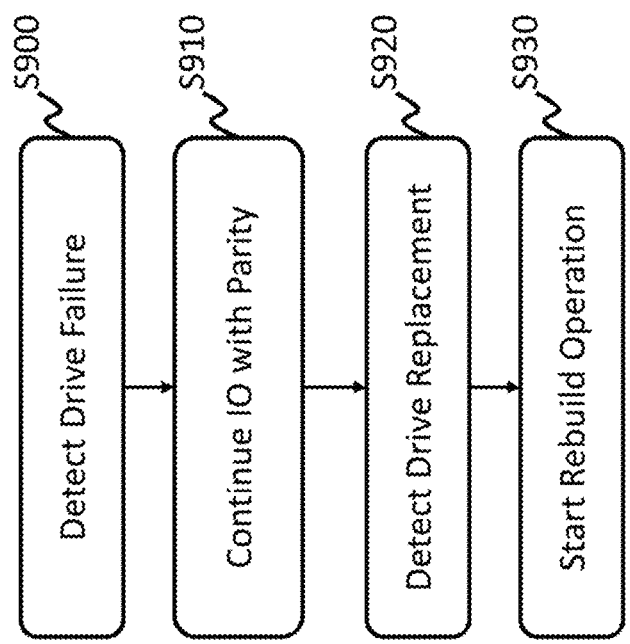

SYSTEM AND METHOD FOR SUPPORTING DATA PROTECTION ACROSS FPGA SSDS

CROSS-REFERENCE TO RELATED APPLICATION(S)

The present application is a continuation-in-part application of U.S. application Ser. No. 15/981,801, filed May 16, 2018, which claims priority to, and the benefit of, U.S. Provisional Patent Application No. 62/638,722, filed on Mar. 5, 2018, and U.S. Provisional Patent Application 62/641,252, filed on Mar. 9, 2018, all of which are incorporated herein by reference.

BACKGROUND

Some embodiments of the present disclosure relate generally to non-volatile memory express (NVMe) solid state drives (SSDs), field programmable gate arrays (FPGAs), and redundant array of independent disks (RAID).

The rapid growth in data has driven a corresponding growth in datacenters and an increasing use of cloud computing. 1U and 2U servers are becoming increasingly popular in order to maximize the use of finite datacenter space. Supporting cloud computing requires datacenters to maintain a high level of reliability while still allowing for easy system configuration. In many instances, cloud computing involves the use of relatively high performance servers that each may operate a number of virtual machines. The virtual machines may then split the resources of the server they are operating on.

RAID is an important tool for providing data protection and improving overall system performance. Implementing RAID with today's NVMe-based SSDs generally requires the use of external PCIe add-in-cards (AICs) (e.g., RAID controllers). Adding AICs to 1U and 2U servers can be problematic due to the due to the physical limitations of the standard form factor of PCIe cards and a limited number of available connections (e.g., U.2 connections). For example, each RAID controller may be configured to support 4 NVMe SSDs. A typical 2U chassis includes 24 NVMe SSDs which in turn requires 6 AICs and creates 6 RAID domains. The inclusion of these AICs and domains raises the overall cost (e.g., in hardware costs and power consumption) and increases the complexity of configuring and using the system.

Adding RAID AICs to a 1U chassis may pose additional issues with space and complexity. For example, only a limited number of RAID AICs can physically be added to a 1U chassis. Thus, the only way to have every drive configured in a RAID setup is to either use a completely software-based system, or to use a combination of hardware and software-based RAID. Both of these setups result in decreased performance and increased complexity.

Erasure coding is another data protection technique that is becoming increasingly popular due to its configurability. Erasure coding allows for data to be split into multiple smaller encoded blocks where the original data can be recovered from a subset of the encoded blocks. A system administrator defines how many pieces the data is divided into and the number of pieces (e.g., parity) required to recover the original data after detecting data corruption. In storage systems, the pieces are distributed to a corresponding drive. For example, if the erasure code were configured as a 10/16 system the data would be split into 16 fragments and could be reconstructed using 10 fragments. The system would split the 16 fragments across 16 drives/nodes/etc.

Although providing increased flexibility, erasure coding may be computationally expensive and can also result in additional network usage. Furthermore, implementing erasure coding may further increase system configuration complexity.

The above information is only for enhancement of understanding of the background of embodiments of the present disclosure, and therefore may contain information that does not form the prior art.

SUMMARY

Some embodiments of the present disclosure provide a system and method for data protection across field programmable gate array (FPGA) solid state disks (SSDs). In various embodiments, the system comprises a storage system having a first group of SSDs connected to a first FPGA. The first FPGA includes a first data protection controller configured to manage input/output requests to and from the first group of solid state disks according to a data protection configuration, generate parity bits according to the data protection configuration, and store the parity bits on at least parity solid state drive from the first group of solid state drives.

In various embodiments, the storage system further includes a processor connected to the first FPGA by a high speed bus and a baseboard management controller (BMC) connected to the first FPGA by the high speed bus, wherein the BMC is configured to provide the data protection configuration.

In various embodiments, the further includes a processor connected to the first FPGA by a high speed bus and a BMC connected to the first FPGA by a low speed bus, wherein the BMC is configured to provide the data protection configuration.

In various embodiments, the storage system further includes a first switch connecting the first FPGA to the first group of solid state drives.

In various embodiments, the storage system further includes a second group of solid state drives connected to a second FPGA connected to the second group of solid state drives by a second switch. The second FPGA comprises a second data protection controller and the first FPGA and the second FPGA are connected by a connection between the first switch and the second switch.

In various embodiments, the first data protection controller sends replication data to and the second data protection controller via the first switch and the second switch.

In various embodiments, the first data protection controller comprises a redundant array of independent disks (RAID) controller.

In various embodiments, the first data protection controller comprises an erasure code controller.

In various embodiments, the storage system includes a first group of SSDs, a second group of SSDs, a FPGA connected to the first group of SSDs, and a second FPGA connected to the second group of SSDs. The FPGA includes a first redundant array of independent disks (RAID) controller and the second FPGA comprises a second RAID controller. The first and second FPGAs are configured to manage input/output requests to and from the first and second groups of solid state disks according to a data protection configuration, generate parity bits for stored data according to the data protection configuration, store the parity bits on at least one parity SSD from the first group of SSDs, and replicate the first group of solid state drives on the second group of solid state drives.

In various embodiments, the storage system further includes a processor connected to the first FPGA and second FPGA by a bus and a BMC connected to the first FPGA and the second FPGA by the bus, wherein the BMC is configured to provide the data protection configuration.

In various embodiments, the bus comprises a peripheral component interconnect express (PCIe) bus.

In various embodiments, the storage system further includes a first PCIe switch connecting the first FPGA to the first group of solid state drives and a second PCIe switch connecting the second FPGA to the second group of solid state drives, wherein the first and second switches connect the first FPGA to the second FPGA.

In various embodiments, the data protection configuration is a hybrid RAID configuration.

In various embodiments, the storage system includes a first group of solid state drives and a first FPGA connected to the first group of SSDs, a processor connected to the first FPGA by a bus, a BMC connected to the first FPGA by the bus and configured to provide the first FPGA with a data protection configuration. The first FPGA includes a first data protection controller configured to manage input/output requests to and from the first group of solid state disks according to the data protection configuration, generate parity bits for data stored in the first group of solid state drives according to the data protection configuration, and store the parity bits on at least one parity solid state drive from the first group of solid state drives.

In various embodiments, the first data protection controller comprises a redundant array of independent disks (RAID) controller.

In various embodiments, the data protection configuration comprises at least one of a RAID 1, RAID 5, or RAID 6 configuration.

In various embodiments, the first data protection controller comprises an erasure coding controller configured to stripe data across a first portion of the first plurality of solid state drives and to generate erasure codes according to the data on a second portion of the first plurality of solid state drives.

In various embodiments, the system further includes a second group of solid state drives and second FPGA, a second FPGA connected to the processor by the bus, the BMC by the bus, and the second group of solid state drives. The second FPGA comprises a second data protection controller configured to manage input/output requests to and from the second group of solid state disks according to the data protection configuration, generate parity bits for data stored in the second group of solid state drives according to the data protection configuration, and store the parity bits on at least one parity solid state drive from the second group of solid state drives.

In various embodiments, the system includes a second plurality of solid state drives, a first peripheral component interconnect express (PCIe) switch connecting the first FPGA to a first downstream PCIe switch and a second downstream PCIe switch. The first downstream PCIe switch is connected to the first group of solid state drives and connects the first group of solid state drives to the first FPGA via the first PCIe switch and the second downstream PCIe switch is connected to the second group of solid state drives and connects the second group of solid state drives to the first FPGA via the first PCIe switch.

In various embodiments, the data protection configuration comprises a hybrid RAID configuration.

BRIEF DESCRIPTION OF THE DRAWINGS

Some embodiments can be understood in more detail from the following description taken in conjunction with the accompanying drawings, in which:

FIG. 9 depicts a method of performing hot removal and add after a drive failure according to various embodiments.

DETAILED DESCRIPTION

Figure 1A:
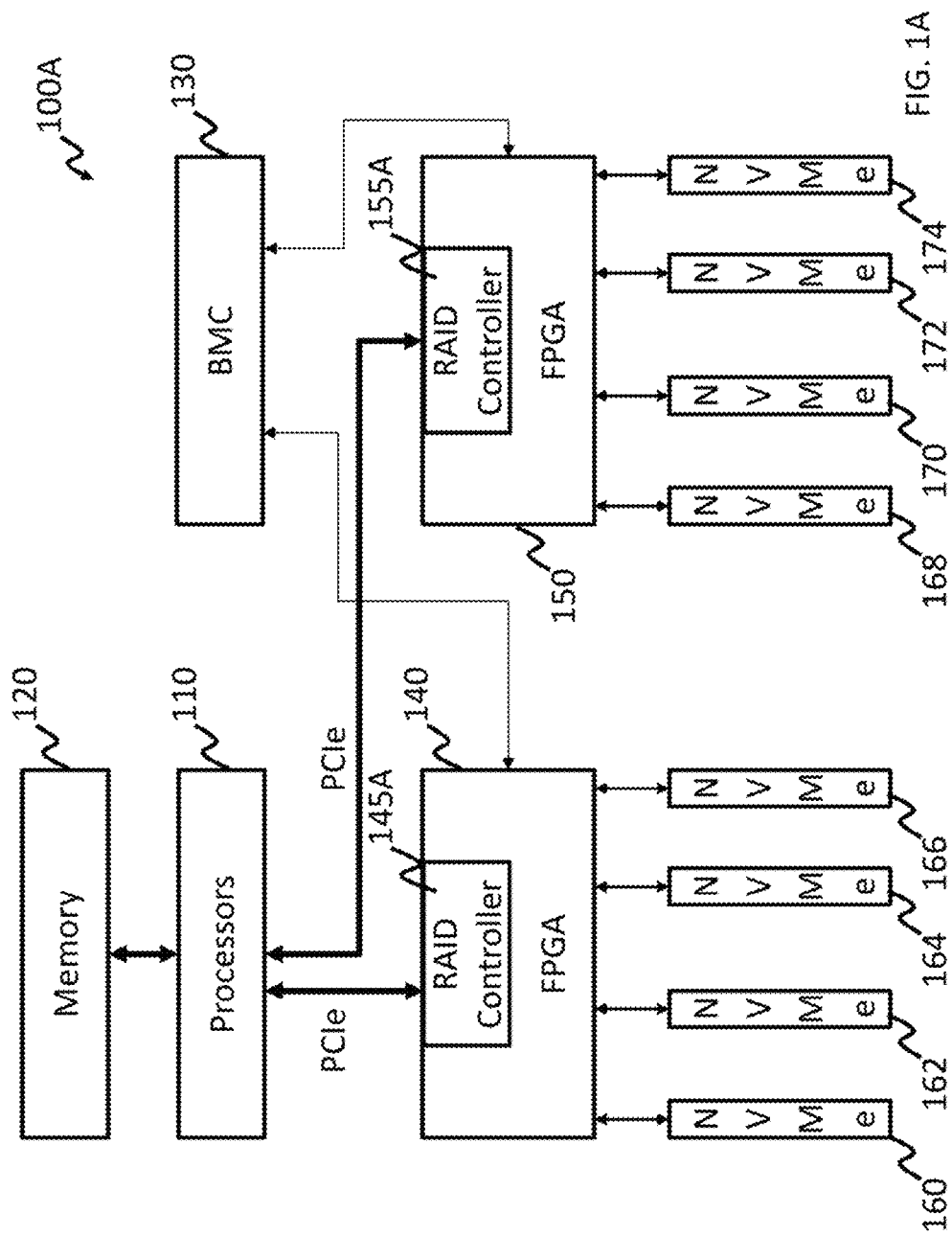
FIGS. 1A and 1B depict a storage system featuring FPGA SSDs according to various embodiments.

Features of the inventive concept and methods of accomplishing the same may be understood more readily by reference to the following detailed description of embodiments and the accompanying drawings. Hereinafter, embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Embodiments of the present invention include a system and method for supporting data protection in a storage system. In various embodiments, a storage system includes at least one FPGA configured to operate in conjunction with one or more solid state disks (SSDs) (e.g, non-volatile memory express (NVMe) SSDs). In various embodiments, the FPGAs may be configured to perform computational operations on data stored in the attached SSDs (e.g., in-storage compute operations). In various embodiments, each FPGA may be configured with a data protection controller for protecting the integrity of the data stored in the storage system. For example, in various embodiments, data protection controller may implement RAID or erasure coding on the attached SSDs instead of using AICs or a software-based implementation. In various embodiments, each FPGA includes computing resources along with high speed input/output (I/O) connectivity for the performance of RAID and erasure code parity generation and data routing.

In the modern data center, the current goal is to maximize storage density and performance while minimizing power consumption. Typical RAID configurations utilize one or more external PCIe add-in-cards (AICs). In order to maximize storage density, modern and future storage server form factors are designed to dedicate as much space as possible to data storage drives (e.g., SSDs). Thus, 1U and 2U form factors have become increasingly popular. These form factors are not without their drawbacks. For example, their small size does not provide much room for adding AICs, the number of PCIe ports may be limited, and their increased density can make cooling more difficult. Thus, it is desirable to limit the number of AICs added to the system.

The current data protection implementations use either AICs for performing RAID or processing power for performing erasure coding. These methodologies have a number of drawbacks. For example, AICs are expensive, consume extra power, and generate extra heat while also using bandwidth on the PCIe bus. Furthermore, if every PCIe slot is utilized to implement RAID, the chassis would have no room for future expansion. Erasure coding provides many of the same benefits as RAID and can provide even more configuration flexibility, however, erasure coding is computationally expensive since most of the coding is done by the server's processor.

Embodiments of the present disclosure improve on these prior methodologies by leveraging the processing power of a storage attached FPGA. By implementing a data protection controller in the FPGA, a data protection scheme may be employed without having to use every available PCIe slots (thereby allowing for future system expansion) and a cost savings in terms of AICs, power, cooling, and processor workload. Furthermore, bandwidth on the main PCIe bus may be utilized for other operations. Thus, storage density and performance may be increased, while reducing power consumption. Additionally, using a data protection controller allows for greater configuration flexibility since the data protection controller is implemented in the FPGA.

Figure 1B:
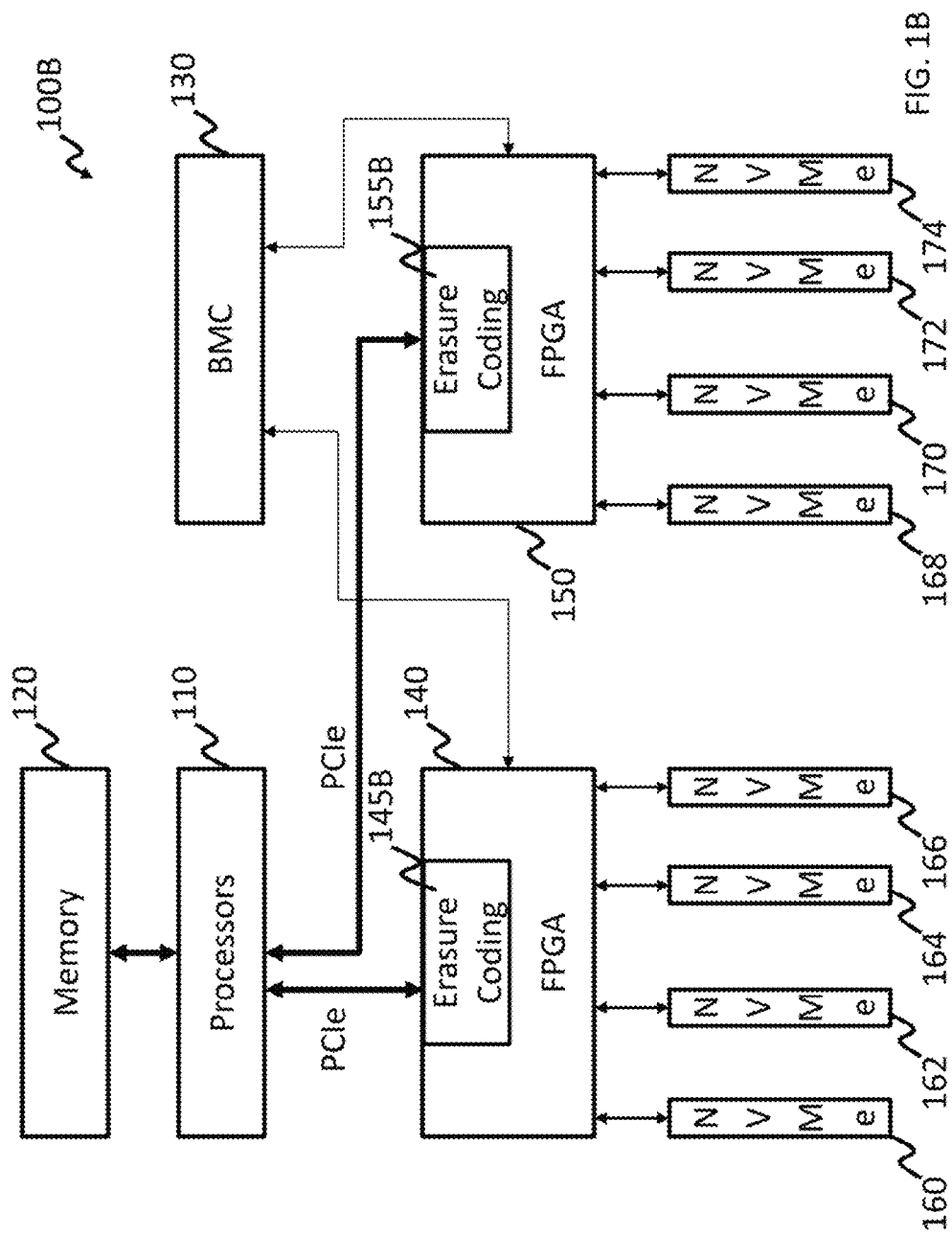

FIGS. 1A and 1B depict a storage system featuring FPGA SSDs according to various embodiments.

Referring to FIGS. 1A and 1B, in various embodiments, a storage system 100A/100B is configured to operate using a data protection configuration implemented in conjunction with a data protection controller operating on an FPGA. In various embodiments, the storage system 100A is configured to operate with RAID and the storage system 100B is configured to operation with erasure coding. The storage systems 100A/100B each include a processor (or processors) 110, a memory 120, a BMC 130, FPGAs 140, 150, and SSDs 160-174 (e.g., NVMe SSDs, NVMe-oF, or any other solid state or spinning disk drive). In various embodiments, the processors 110 are connected to the NVMe SSDs 160-174 via the FPGAs 140, 150. Although the processors 110 are configured to handle most primary computational operations, in various embodiments, the FPGAs 140, 150 are configured to perform a variety of computational operations on the data stored in the correspondingly attached SSDs 160-174 (e.g., in-storage compute operations). The FPGAs 140, 150 are connected to the processor 110 by a high speed bus (e.g., PCIe x8/x16) configured to both transport data to and from the FPGAs 140, 150 as well as to transport commands for execution by FPGAs 140, 150. In some embodiments, the FPGAs 140, 150 may be directly connected to the BMC 130 by a relatively lower speed bus (e.g. PCIe x1) for performing configuration and control operations on the FPGAs 140, 150 and the attached SSDs 160-174. In various embodiments, the FPGAs 140, 150 may each include one or more data protection controllers 145A/B, 155A/B. In various embodiments, the data protection controllers 145A/B, 155A/B may be implemented by the FPGAs 140, 150. In other embodiments, the data protection controllers 145A/B, 155A/B may be implemented as an application-specific integrated circuit (ASIC) on the same die as the FPGAs 140, 150.

In various embodiments, the BMC 130 may be used to designate a data protection configuration for the data protection controllers 145A/B, 155A/B. In some embodiments, the BMC 130 may have a hard-coded path where a specific data protection configuration is automatically applied with the system is initialized. For example, the BMC 130 may apply the data protection configuration according to a BIOS configuration or software interface. In other embodiments, an administrator has the option of setting the default or hard-coded setting by modifying either the BIOS or interfacing software. In various embodiments, an administrator selects the different data protection configuration employed during a configuration step. For example, an administrator may select to implement erasure coding or RAID depending on their application. In some embodiments, the BMC 130 may be used to configure multiple data protection controllers 145A/B, 155A/B on each FPGA 140, 150. For example, in some embodiments, the server 100A/100B may operate multiple virtual machines that may be utilized by multiple users and data protection controllers 145A/B, 155A/B may be implemented for each virtual machine.

In various, each FPGA 140, 150 may operate with several SSDs 160-174. In the depicted examples, each FPGA 140, 150 is configured to operate with four SSDs, however, it should be understood that the ratio of FPGAs to SSDs may be modified to include one FPGA for each SSD to multiple SSDs for each FPGA.

Referring to FIG. 1A, in various embodiments, each FPGA 140, 150 has a data protection controller that operates a data protection scheme according to a data protection configuration (e.g., the configuration designated by the BMC 130). For example, in various embodiments, the data protection controller may be configured to operate as a RAID controller 145A, 155A. In various embodiments, a user (e.g., a system administrator) may configure the RAID controllers 145A, 155A to implement a desired RAID configuration (e.g., RAID 0, 1, 5, 6, etc.) and designate the drives 160-174 to be used (e.g., create groups based on the total number of drives connected to the RAID controller 145A, 155A).

For example, in various embodiments, the FPGAs 140, 150 may each be connected to 4 SSDs 160-174 and configured to each operate in a RAID 5 configuration with data being striped across three drives and a fourth drive being used for parity. In another example, the FPGAs 140,150 may be connected to 5 SSDs 160-174 and configured to each operate in a RAID 6 configuration.

In various embodiments, the RAID controller 145A, 155A is managed by the BMC 130. Thus, a system administrator may access the BMC 130 for the initial configuration of the RAID controllers 145A, 155A as well as for performing any changes in configuration, performance monitoring, performing system maintenance, etc. For example, the BMC 130 may provide an interface (e.g., a graphical user interface or command line interface) for users for configuration and can provide an interface for software for some configurations.

Referring to FIG. 1B, in various embodiments, each FPGA's 140, 150 data protection controller operates according to a data protection configuration designating erasure code operation. For example, in various embodiments, the data protection controller may operate as an erasure coding controller 145B, 155B. In various embodiments, the erasure coding controllers 145B, 155B are each configured to operate in an M/N erasure coding configuration (e.g., the data is split across M drives and can be recovered using only N drives). For example, in various embodiments, the FPGAs 140,150 may each be connected to 4 SSDs 160-174 and configured to operate in a 1/4, 2/4, or 3/4 configuration. In another example, each of the FPGAs 140,150 may be connected to 8 SSDs 160-174 and configured to each operate in, for example, a 5/8 configuration. It should be understood that the erasure coding configuration and number of SSDs connected to the FPGA may be modified according and the available SSDs and user design requirements.

In various embodiments, the configuration of the erasure coding controller 145B, 155B is managed by the BMC 130. For example, the BMC 130 may provide an interface for users to perform an initial setup, check device status, perform device maintenance, modify the configuration, etc. Thus, an administrator can easily configure the storage system to with their desired data protection scheme.

Figure 2:
FIG. 2 depicts an embodiment that includes an FPGA with a PCIe switch according to various embodiments.

FIG. 2 depicts an embodiment that includes an FPGA with a PCIe switch according to various embodiments.

Referring to FIG. 2, in various embodiments, the storage system 200 may be configured with a variety of data protection schemes. In various embodiments, the attached NVMe SSDs 230-252 may be viewed by a host as a single host visible drive 210. Thus, from a host perspective, the configuration of the storage system 200 isn't a factor in operation. In various embodiments, the FPGA 220 may be attached to or have an integrated PCIe switch. In various embodiments, adding a PCIe switch provides further configuration flexibility and allows for the use of fewer FPGAs 220 and thereby further reducing system cost. Furthermore, traffic on the system PCIe bus may be reduced since RAID/erasure code operations along with any in-store compute operations of the FPGA 220 are confined to a separate PCIe bus serviced by the PCIe switch.

In various embodiments, the storage system 200 may be configured (e.g., by an administrator accessing the BMC 130) to operate using RAID 5, using an X/Y erasure code configuration, or using RAID 0. In the depicted embodiment, the storage system includes 12 attached SSDs 230-252. Thus, when the system 200 is configured in a RAID 5 configuration, 11 drives 230-250 may be used for storing data (e.g., data is striped across the 11 drives) and 1 drive 252 is used for storing parity bits. Similarly, when the system 200 is configured to operate with erasure code, x drives may be used for storing data and y drives are used for storing codes. In another embodiment, the system may be configured as RAID 0 (data stripe with no parity) and all of the drives are used as data drives.

Figure 3:
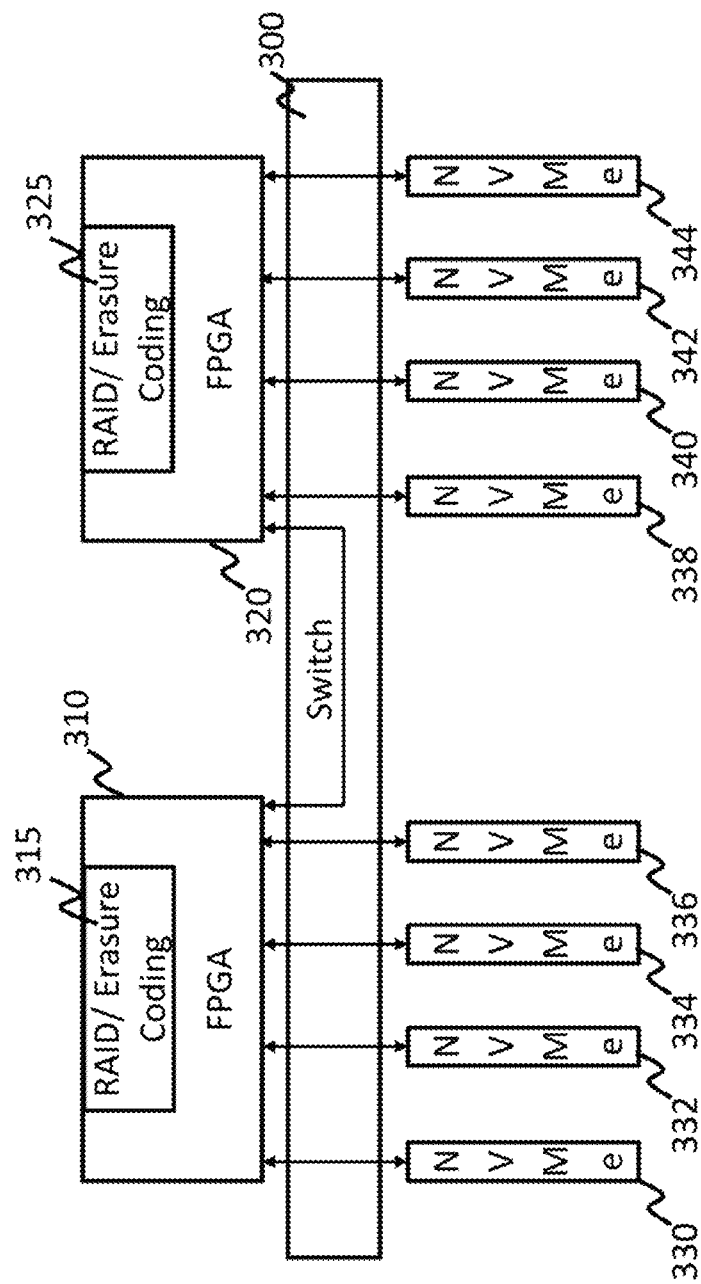
FIG. 3 depicts a storage system including multiple FPGAs connected to SSDs according to various embodiments.

FIG. 3 depicts a storage system including multiple FPGAs connected to SSDs according to various embodiments.

Referring to FIG. 3, in various embodiments, the storage system 300 may further include one or more PCIe switches 300 connected to or operating on each FPGA 310, 320. The PCIe switches 300 may be used to increase the number of NVMe drives 330-360 each FPGA 310, 320 is connected to and connect two or more FPGAs 310, 320 to provide additional data protection configurations. Thus, additional layers of data security and configurability may be selected by an administrator.

For example, in the depicted embodiment, each FPGA 310, or 320 is connected to 4 NVMe SSDs 330-344 using the PCIe switch 300. Additionally, the FPGAs 310, 320 are also connected to each other via the PCIe switch 300. Thus, when the FPGAs 310, 320 are operating a RAID or Erasure Code Controller 315, 325, the RAID or Erasure code configuration may incorporate additional FPGAs and their associated drives and thereby providing further configuration flexibility. For example, in various embodiments, a first FPGA 310 may be paired with one or more FPGAs, such as the second FPGA 320. The additional FPGA (e.g., the FPGA 320) and its corresponding drives (e.g., the NVMe SSDs 338-344) may be used for data replication (e.g., data mirroring) providing an additional layer of data security. In various embodiments, a hybrid RAID or nested RAID configuration such as RAID 10, RAID 50, etc. may be implemented using multiple FPGAs and their corresponding drives.

Figure 4:
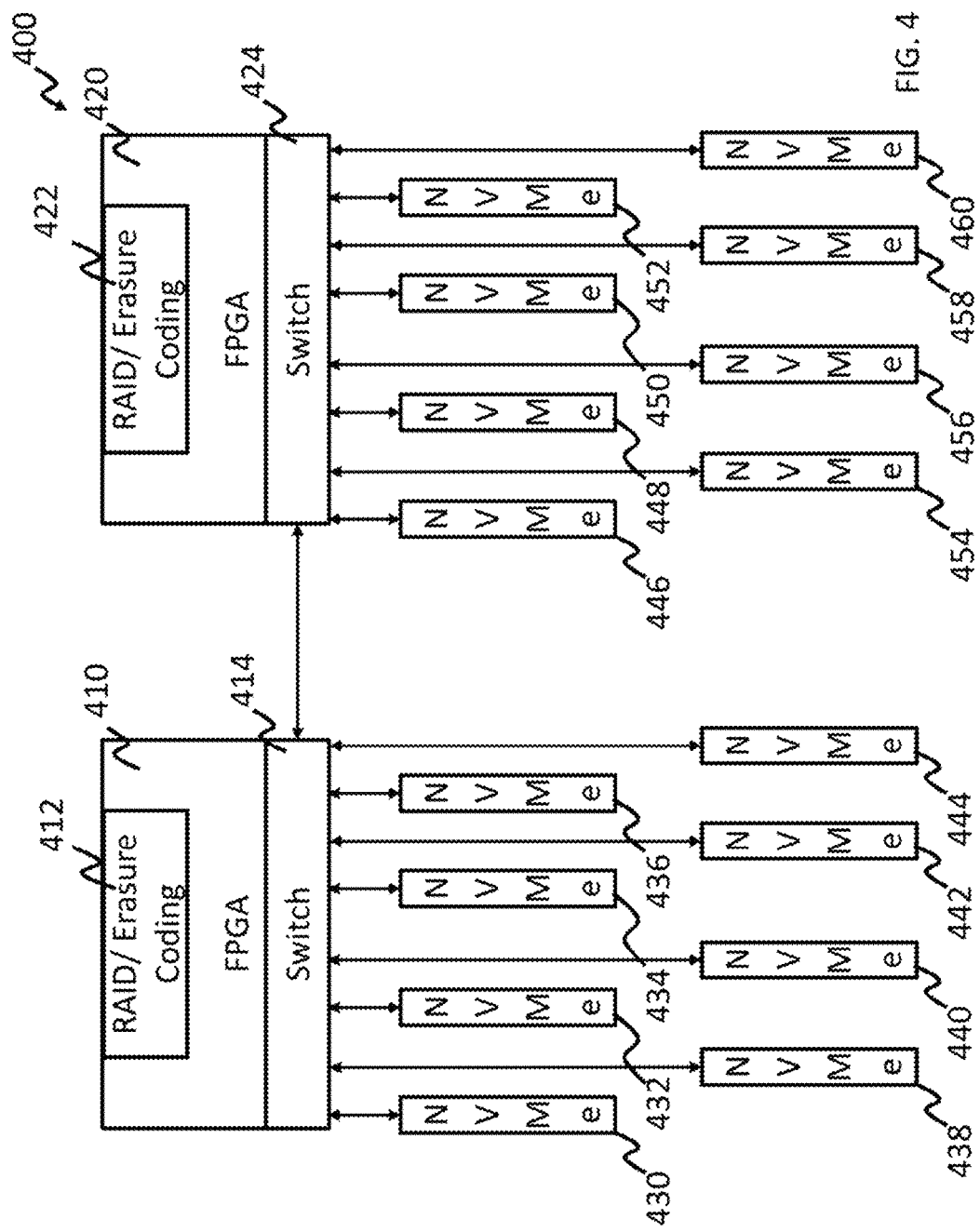
FIG. 4 depicts an example storage system having multiple PCIe switches according to various embodiments.

FIG. 4 depicts an example storage system having multiple PCIe switches according to various embodiments.

Referring to FIG. 4, in various embodiments, each FPGA 410, 420 of the storage system 400 may include a switch 414, 424 (e.g., a PCIe switch). In various embodiments, the PCIe switches 414, 424 coupled to the data protection controllers 412, 422 (e.g., a RAID or erasure code controllers) provide for additional configuration flexibility. For example, in the depicted embodiment, the use of PCIe switches 414, 424 allows for more drives to be logically connected to each FPGA 410, 420. For example, in the depicted embodiment, each of the FPGAs 410, or 420 is connected to 8 NVMe SSDs 430-460. In other embodiments, the FPGAs 410, 420 may be logically connected to more or less drives. Furthermore, as discussed above, a hybrid RAID configuration may be employed using two or more FPGAs 410, 420 and their associated drives 430-460.

Figure 5:
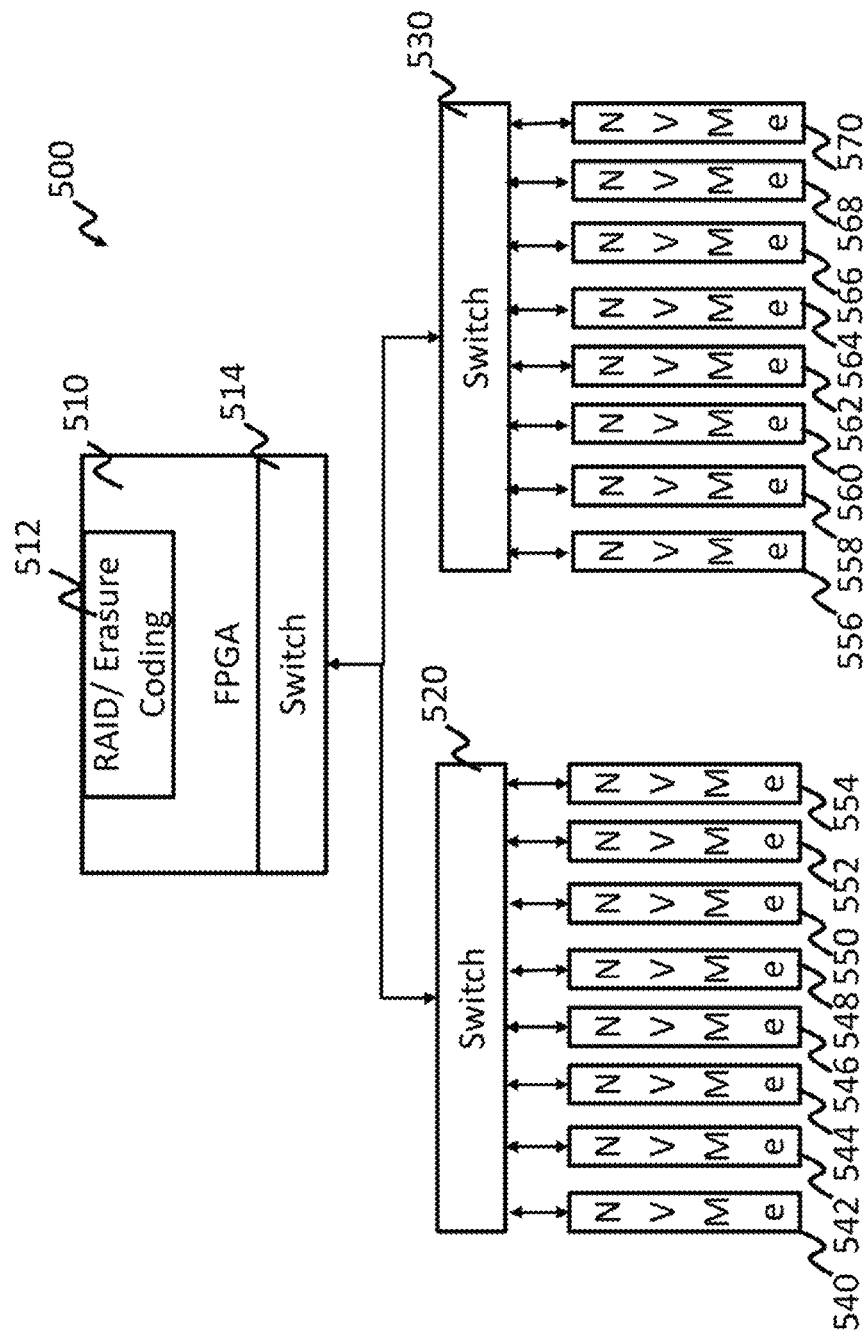
FIG. 5 depicts an example storage system having a multiple tiers of switches according to various embodiments.

FIG. 5 depicts an example storage system having a multiple tiers of switches according to various embodiments.

Referring to FIG. 5, in various embodiments, a storage system 500 may include as single FPGA 510 connected to a plurality of NVMe SSDs 540-570 by multiple PCIe switches 514, 520, 530. In various embodiments, the FPGA 510 may include a data protection controller 512 configured to perform RAID and/or erasure code operations and be logically connected to a first PCIe switch 514. The first PCIe switch 514 (e.g., at a first tier) may connect the FPGA 510 to two or more downstream PCIe switches 520, 530 (e.g., at a second tier), each of which connects to a portion of the plurality of SSDs 540-570. In the depicted example, a first downstream PCIe switch 520 may be logically connected to 8 SSDs 540-554 and the second downstream PCIe switch 530 may be logically connected to 8 SSDs 556-570. The use of additional PCIe switches allows for further configuration options for protecting the data stored on the plurality of NVMe SSDs 540-570. As discussed above with reference to FIG. 4, multiple PCIe switches may be used to implement hybrid RAID configurations. For example, RAID 10 may be implemented by having drives under the first downstream switch 520 implement RAID 1 (mirroring) between each drive and striping these drives across the drives connected to the second downstream switch 530. In another setup, the first and second downstream switches 520, 530 may implement RAID 5 and they may be striped using RAID 0 to form RAID 50. It should be understood that these RAID implementations are used as examples and that any hybrid RAID implementation may be configured using the appropriate number of drives and switches.

Figure 6:
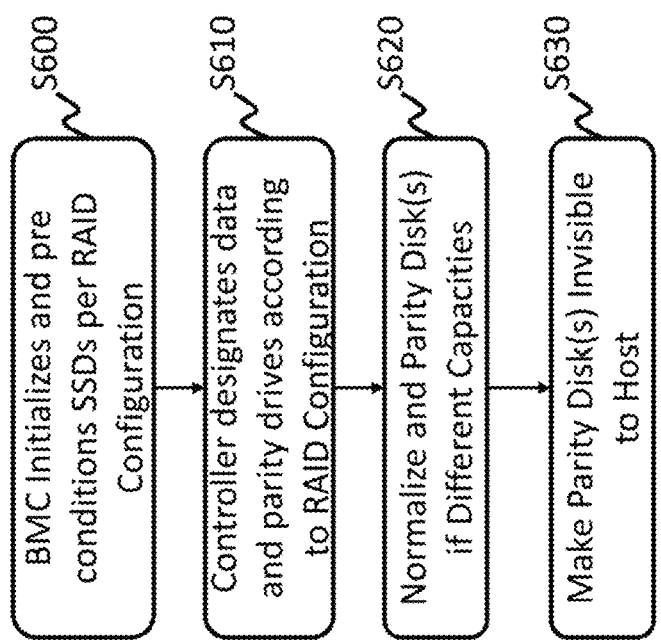
FIG. 6 depicts a method of performing system initialization according to various embodiments.

FIG. 6 depicts a method of performing system initialization according to various embodiments.

Referring to FIG. 6 as well as to FIGS. 1A and 1B, in various embodiments, a BMC 130 may be configured for performing an initial setup of the data protection scheme employed by a storage system 100A/100B. In various embodiments, a storage system 100A/100B may be initialized for use by an administrator. For example, the storage system 100A/100B may be a cloud storage server that has been requisitioned for a client and needs configuration. In various embodiments, a BMC 130 initializes and preconditions the SSDs according to a RAID or erasure code configuration (S600) (as will be discussed with reference to FIG. 7). For example, as discussed above, the BMC 130 may have a hard-coded path where a specific data protection scheme is also applied or a configurable setup. Based on the configuration provided by the BMC 130, the data protection controller 145A/B, 155A/B designates the data and parity (or erasure code) drives to satisfy the requirements of the designated data protection scheme (S610). In various embodiments, the data protection controller 145A/B, 155A/B may normalize any attached data or parity disks having different capacities (S620). The controller 145A/B, 155A/B may then make the parity disks invisible to any hosts (S630) (e.g., they are removed from the total capacity of the visible drive).

Figure 7:
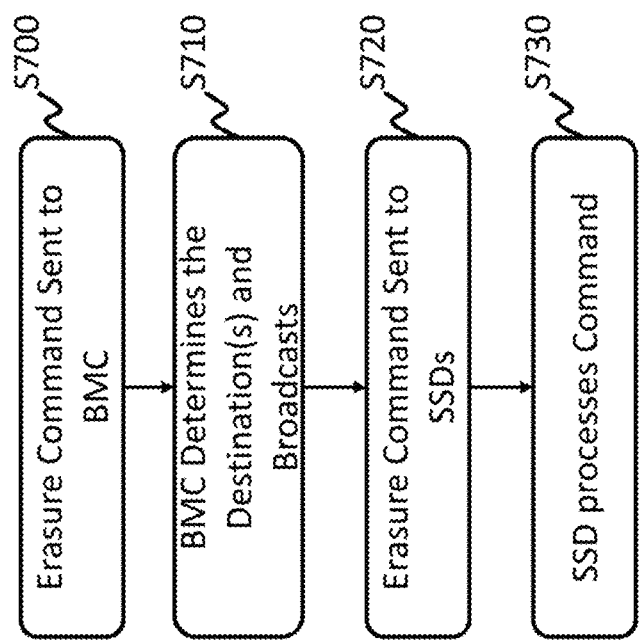
FIG. 7 depicts a method of preconditioning SSDs according to various embodiments.

FIG. 7 depicts a method of preconditioning SSDs according to various embodiments.

Referring to 7 and with continued reference to FIGS. 1A and 1B, in various embodiments, upon the initialization of the system 100A/B, the system may precondition the drives by erasing all of the contents stored on them. For example, in cloud computing applications, there may be a variety of user of the system, each having private data stored on the attached drives. Any prior user data should be securely deleted before the storage server may be used by another user. In conventional systems, wiping the data from large drives from a remote host can be a very long process as it usually involves the writing over of every bit of storage multiple times. As drives have increased in capacity, this operation has subsequently also increased in duration. In various embodiments, the storage system 100A/B may expedite the data erasing process by distributing the task using the BMC 130 and the FPGAs 140, 150. For example, an erase command may be received at the BMC 130 from an administrator before assigning the drives to a new user (S700). In various embodiments, the erasure command may be for a specific namespace or range. The BMC 130 may then determine which FPGAs are associated with the command (e.g., the drives apportioned to the host sending the command) and broadcasts the command using the low speed bus connected to each FPGA 140, 150 (S710). The erase command is then forwarded to each of the targeted drives (S720). Each drive processes the command and erases its contents (e.g., prior user data) (S730). Thus, the erasure command is executed in a parallel fashion and the total execution time may be greatly reduced. Additionally, offloading the erasure to the BMC/FPGA allows for the system CPU to be free to work on other tasks. Furthermore, using the data path (e.g., the BMC path) creates a secure channel for maintenance operations.

Figure 8:
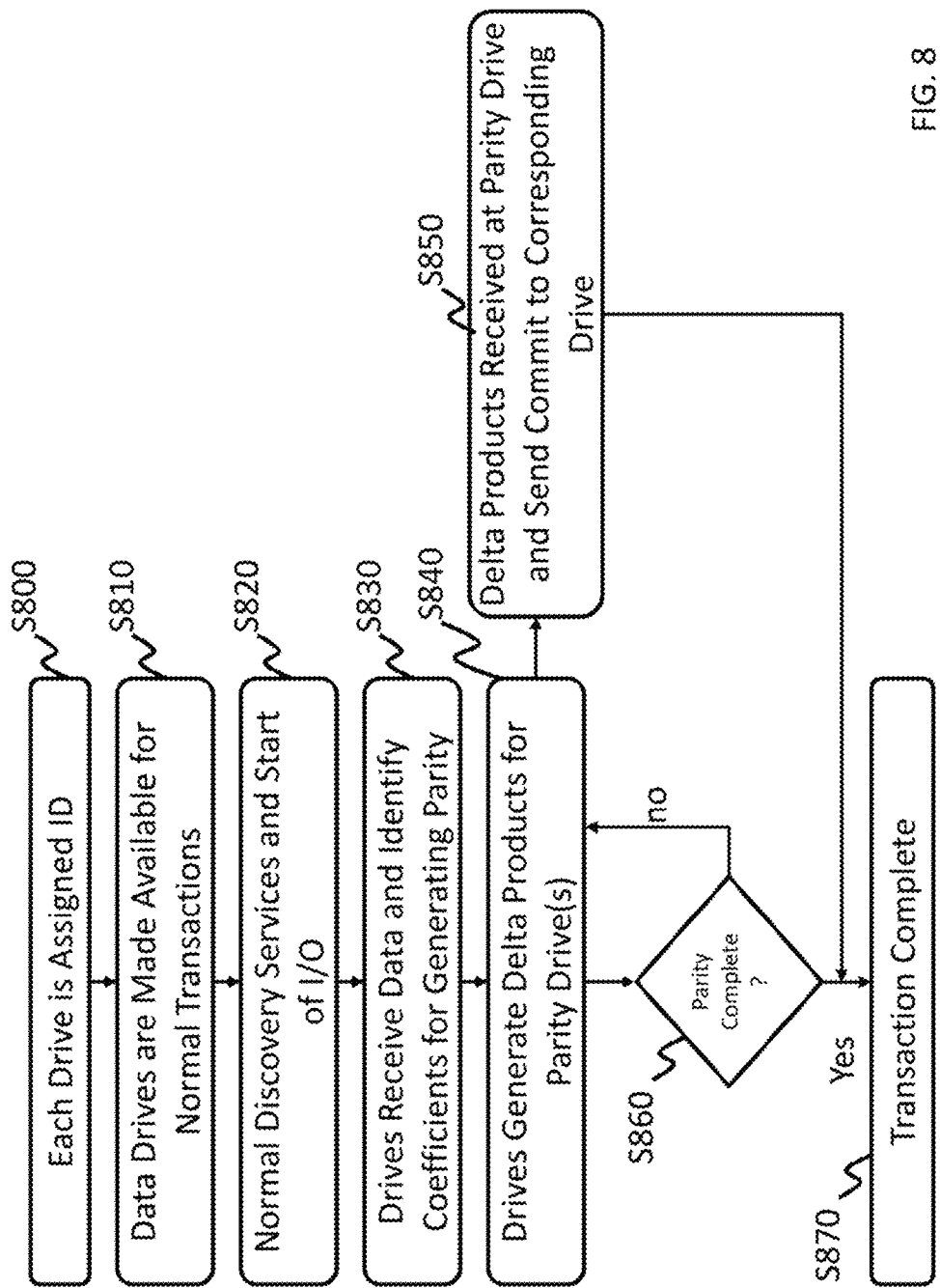
FIG. 8 depicts a method of performing I/O with parity generation according to various embodiments.

FIG. 8 depicts a method of performing I/O with parity generation according to various embodiments.

Referring to FIG. 8, in various embodiments, the storage system is configured to generate parity bits according to a data protection scheme. Upon initialization of the system, the system may begin with some configuration steps. For example, each attached drive (e.g., the drives 160-174) may include a unique member identification such as a slot number or assigned identification number from the data protection controller (e.g., the data protection controller 145). Drives may then be made available for normal transactions (S810). For example, a user or application may access the system using a BMC and select the type of data protection scheme may be selected and drives may be designated as data disks or parity disks (e.g., the data protection controller 145). Once designated as a parity disk, a drive may no longer be visible to a host or an upper level data protection controller (e.g., in the case of tiered controllers as shown in FIG. 5). After the initialization, the drives may then be discoverable by the host and I/O transactions may be initiated (S820). The host may then begin writing data to the drives, and in some embodiments, the drives may be configured to identify coefficients that will be used for generating parity values (S830). The drives may then use the coefficients to generate delta products for use by the parity drive(s) (S840). For example, the drives may perform a read of a target logical block address (LBA), XOR the read data with new data, multiply by coefficients, write new data to the LBA, and then transfer the delta products to the parity disks with the LBA info. The parity disks may the receive the delta product information, read LBA data, XOR delta with read info, and write information, and send the commit to the corresponding parity disk (S850). Once the parity is complete (S860), the transaction may be reported to the host as being completed (S870).

FIG. 9 depicts a method of performing hot removal and add after a drive failure according to various embodiments.

Referring to FIG. 9, in various embodiments, the storage system may be configured to recover from failures using the BMC and the data protection controller (e.g., the BMC 130 and the data protection controller 145A/B, 155A/B of FIG. 1). In various embodiments, the BMC 130 can detect when a drive failure or removal (S900). In various embodiments the BMC 130 may detect the failure or removal of the drive in several ways. For example, in one embodiment all the drives have presence pins connected to the BMC 130 via the mid-plane. Thus, when a drive is physically removed from the chassis, the BMC 130 detects the removal. In various embodiments, the BMC 130 also periodically monitors health of each attached drives. When the BMC 130 detects any fatal error conditions reported by the drive, the BMC 130 may decide to take that SSD out of service. In either case, the BMC 130 reports the location of the malfunctioning drive (e.g., the corresponding physical slot number) to the controller in the FPGA 140, 150. In another embodiment, the FPGA 140, 150 is capable of supporting hot plug-in where all drives are connected through PCIe sideband signals. Thus, the FPGA 140, 150 can detect certain error conditions including when a drive is pulled out or added in, or PCIe link to the drive is no longer operational. In various embodiments, in such error situation, controller in the FPGA 140, 150 may isolate the failed drive or BMC 130 may do so by disabling the power to the failed drive and immediately start rebuilding the drive.

In various embodiments, the data protection controller is responsible for maintaining the performance of I/O requests when a drive has failed. Thus, the data protection controller may use one or more parity drives or erasure code drives to rebuild the data and perform normal I/O until a new drive is provided (S910). In various embodiments, when a new drive is inserted, the BMC may again intervene and configure the new drive as part of the group(s) or initiate a rebuild operation (S920). The controller may then initiate the rebuild (S930). Thus, the recovery paths in this system is configured to provide as minimum as possible a performance impact while providing lower latencies in the data access paths.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The inventive concept is defined by the following claims, with equivalents of the claims to be included therein.

What is claimed is:

1. A storage system comprising:
   a processor;
   a first group of storage devices;
   two or more PCIe slots; and
   a first field programmable gate array (FPGA) connected to the processor via a processor connection, and connected to the first group of storage devices, the processor connection comprising a first bus both configured to transport data to and from the first FPGA, and configured to transport commands for execution by the first FPGA,
   wherein the first FPGA comprises a first data protection controller configured to:
      manage input/output requests to and from the first group of storage devices according to a data protection configuration employing a data protection scheme having one or more of the two or more PCIe slots being vacant;
      generate one or more parity bits according to the data protection configuration; and
      store the one or more parity bits on at least a parity storage device from among the first group of storage devices.

2. The storage system of claim 1, further comprising a baseboard management controller (BMC) connected to the first FPGA by the first bus,
   wherein the BMC is configured to provide the data protection configuration.

3. The storage system of claim 1, further comprising a baseboard management controller (BMC) connected to the first FPGA by a second bus comprising a low speed bus,
   wherein the BMC is configured to provide the data protection configuration, and
   wherein the first bus comprises a high speed bus.

4. The storage system of claim 1, further comprising a first switch connecting the first FPGA to the first group of storage devices.

5. The storage system of claim 1, further comprising:
   a second group of storage devices; and
   a second FPGA connected to the second group of storage devices by a second switch,
   wherein:
      the second FPGA comprises a second data protection controller; and
      the first FPGA and the second FPGA are connected by a connection between a first switch and the second switch.

6. The storage system of claim 5, wherein the first data protection controller sends replication data to the second data protection controller via the first switch and the second switch.

7. The storage system of claim 1, wherein the first data protection controller comprises a redundant array of independent disks (RAID) controller.

8. The storage system of claim 1, wherein the first data protection controller comprises an erasure code controller.

9. A storage system comprising:
   a processor;
   a first group of storage devices;
   a second group of storage devices;
   two or more PCIe slots;
   a first field programmable gate array (FPGA) connected to the processor, via a processor connection, and connected to the first group of storage devices, the processor connection comprising a bus both configured to transport data to and from the first FPGA, and configured to transport commands for execution by the first FPGA, wherein the first FPGA comprises a first redundant array of independent disks (RAID) controller; and
   a second (FPGA) connected to the second group of storage devices, wherein the second FPGA comprises a second RAID controller, wherein the first and second FPGAs are configured to:
      manage input/output requests to and from the first and second groups of storage devices according to a data protection configuration employing a data protection scheme having one or more of the two or more PCIe slots being vacant;
      generate one or more parity bits for stored data according to the data protection configuration;
      store the one or more parity bits on at least one parity storage device from the first group of storage devices; and
      replicate the first group of storage devices on the second group of storage devices.

10. The storage system of claim 9, further comprising a baseboard management controller (BMC) connected to the first FPGA and the second FPGA by the bus,
    wherein the BMC is configured to provide the data protection configuration, and
    wherein the second FPGA is connected to the processor by the bus.

11. The storage system of claim 10, wherein the bus comprises a peripheral component interconnect express (PCIe) bus.

12. The storage system of claim 9, further comprising:
    a first PCIe switch connecting the first FPGA to the first group of storage devices; and
    a second PCIe switch connecting the second FPGA to the second group of storage devices wherein the first and second PCIe switches connect the first FPGA to the second FPGA.

13. The storage system of claim 9, wherein the data protection configuration comprises a hybrid RAID configuration.

14. A storage system comprising:
    a first group of storage devices;
    two or more PCIe slots;
    a first field programmable gate array (FPGA) connected to the first group of storage devices;
    a processor connected to the first FPGA by a first bus both configured to transport data to and from the first FPGA, and configured to transport commands for execution by the first FPGA; and a baseboard management controller (BMC) connected to the first FPGA by a second bus and configured to provide the first FPGA with a data protection configuration, wherein the first FPGA comprises a first data protection controller configured to:

manage input/output requests to and from the first group of storage devices according to the data protection configuration employing a data protection scheme having one or more of the two or more PCIe slots being vacant;

generate one or more parity bits for data stored in the first group of storage devices according to the data protection configuration; and store the one or more parity bits on at least one parity storage device from the first group of storage devices.

15. The storage system of claim 14, wherein the first data protection controller comprises a redundant array of independent disks (RAID) controller.

16. The storage system of claim 15, wherein the data protection configuration comprises at least one of a RAID 1, RAID 5, or RAID 6 configuration.

17. The storage system of claim 14, wherein the first data protection controller comprises an erasure coding controller configured to stripe data across a first portion of the first group of storage devices and to generate erasure codes according to the data on a second portion of the first group of storage devices.

18. The storage system of claim 14, further comprising:
a second group of storage devices; and
a second FPGA connected to the processor by the first bus, the BMC by the second bus, and the second group of storage devices, wherein the second FPGA comprises a second data protection controller configured to:

manage input/output requests to and from the second group of storage devices according to the data protection configuration;

generate one or more parity bits for data stored in the second group of storage devices according to the data protection configuration; and store the one or more parity bits on at least one parity storage device from the second group of storage devices.

19. The storage system of claim 14, further comprising:
a second group of storage devices; and
a first peripheral component interconnect express (PCIe) switch connecting the first FPGA to a first downstream PCIe switch and a second downstream PCIe switch, wherein:

the first downstream PCIe switch is connected to the first group of storage devices for connecting the first group of storage devices to the first FPGA via the first PCIe switch; and the second downstream PCIe switch is connected to the second group of storage devices for connecting the second group of storage devices to the first FPGA via the first PCIe switch.

20. The storage system of claim 14, wherein the data protection configuration comprises a hybrid RAID configuration.

* * * * *